United States Patent
Hirabayashi (10) Patent No.: US 7,605,634 B2
(45) Date of Patent: Oct. 20, 2009

(54) SUBTRACTOR CIRCUIT AND OPERATIONAL AMPLIFIER

(75) Inventor: Atsushi Hirabayashi, Tokyo (JP)

(73) Assignee: Sony Corporation (JP)

( * ) Notice: Subject to any disclaimer, the term of this patent is extended or adjusted under 35 U.S.C. 154(b) by 20 days.

(21) Appl. No.: 11/904,026

(22) Filed: Sep. 25, 2007

(65) Prior Publication Data

US 2008/0088372 A1 Apr. 17, 2008

(51) Int. Cl.
*G06G 7/12* (2006.01)

(52) U.S. Cl. .......................... 327/355; 327/361; 330/69

(58) Field of Classification Search .................. 327/361, 327/65–67, 89; 330/69, 252–261
See application file for complete search history.

(56) References Cited

U.S. PATENT DOCUMENTS

| | | | | |
|---|---|---|---|---|
| 6,768,379 B2 * | 7/2004 | Umeda et al. | ................ | 330/261 |
| 6,778,014 B2 * | 8/2004 | Rennig | ................ | 330/253 |
| 6,920,187 B2 * | 7/2005 | Penney | ................ | 375/316 |
| 6,927,629 B2 * | 8/2005 | Tomita | ................ | 330/252 |
| 7,135,923 B2 * | 11/2006 | Dekkers et al. | ................ | 330/252 |
| 7,375,559 B1 * | 5/2008 | Cho et al. | ................ | 327/65 |
| 7,459,980 B2 * | 12/2008 | Drottar | ................ | 330/304 |
| 2002/0060598 A1 * | 5/2002 | Kimura | ................ | 327/361 |
| 2005/0140444 A1 * | 6/2005 | Dekkers et al. | ................ | 330/258 |
| 2006/0103447 A1 * | 5/2006 | Randazzo | ................ | 327/361 |
| 2006/0139097 A1 * | 6/2006 | Mukherjee et al. | ................ | 330/257 |
| 2007/0132500 A1 * | 6/2007 | Embabi et al. | ................ | 327/359 |
| 2008/0088372 A1 * | 4/2008 | Hirabayashi | ................ | 330/252 |
| 2008/0143439 A1 * | 6/2008 | Tanimoto et al. | ................ | 330/253 |

FOREIGN PATENT DOCUMENTS

JP 04-185005 A 7/1992
JP 2008092090 A * 4/2008

* cited by examiner

*Primary Examiner*—Lincoln Donovan
*Assistant Examiner*—Adam D Houston
(74) *Attorney, Agent, or Firm*—Lerner, David, Littenberg, Krumholz & Mentlik, LLP (57) ABSTRACT

Disclosed herein is a subtractor circuit for outputting an output voltage as a difference between a first input voltage and a second input voltage. The subtractor circuit may include a first semiconductor element, a second semiconductor element, a third semiconductor element, a fourth semiconductor element, a fifth semiconductor element, and a sixth semiconductor element configured to each invert a voltage input to an input terminal and output the inverted voltage from an output terminal; an input terminal of the first semiconductor element; an input terminal of the second semiconductor element; an output terminal of the first semiconductor element; and an output terminal of the third semiconductor element.

8 Claims, 6 Drawing Sheets

SUBTRACTOR CIRCUIT AND OPERATIONAL AMPLIFIER

CROSS-REFERENCE TO RELATED APPLICATIONS

This application claims priority from Japanese Patent Application No. JP 2006-268160 filed in the Japanese Patent Office on Sep. 29, 2006, the entire content of which is incorporated herein by reference.

BACKGROUND OF THE INVENTION

1. Field of the Invention

The present invention relates to a subtractor circuit and an operational amplifier, and particularly to a subtractor circuit and an operational amplifier that are advantageous for driving at a low voltage.

2. Description of the Related Art

An IC (Integrated Circuit) used for control of an electronic device or the like generally includes electronic parts such as an operational amplifier and the like. The operational amplifier includes semiconductor elements such as BJTs (Bipolar Junction Transistors), MOSs (Metal Oxide Semiconductors) or the like. The circuit configuration of the operational amplifier is substantially the same regardless of whether the semiconductor elements forming the operational amplifier are BJTs or MOSs.

Figure 1:
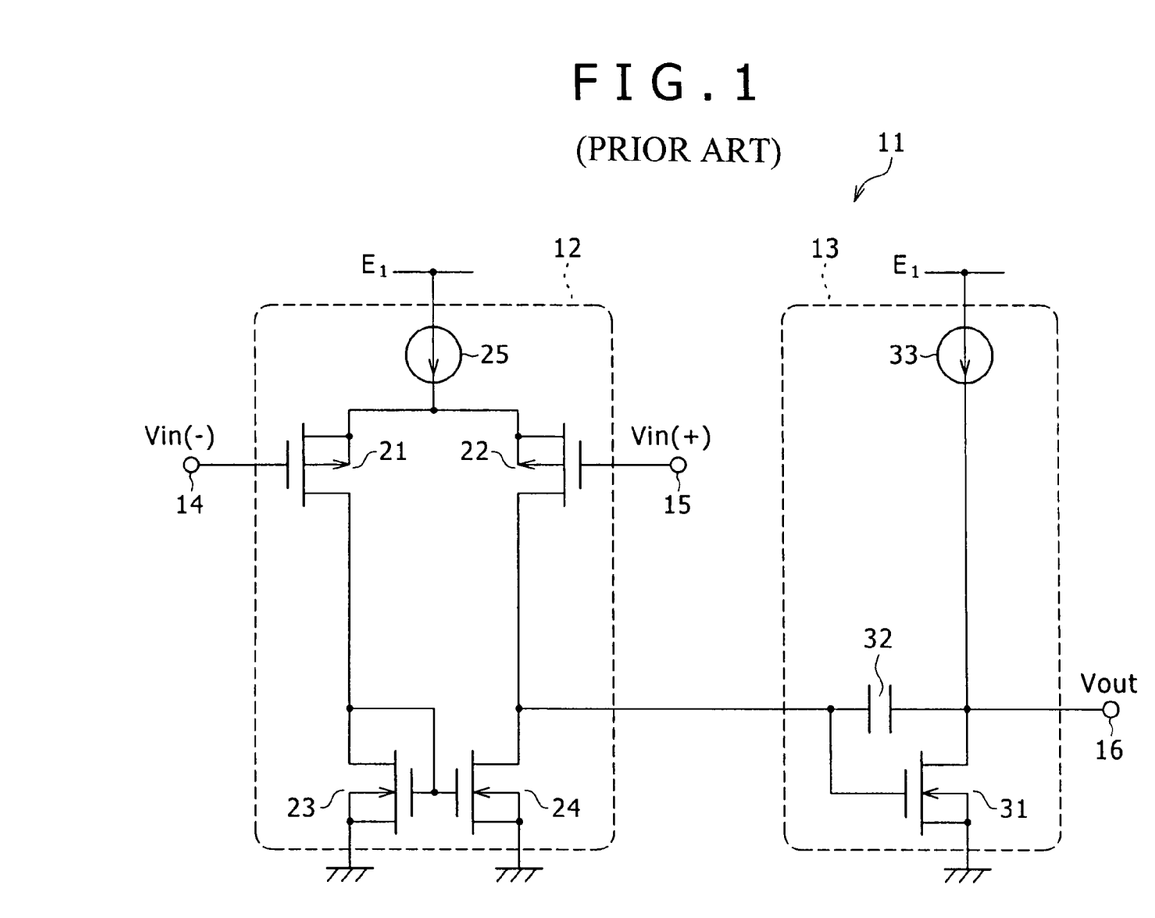
FIG. 1 is a circuit diagram showing the configuration of an example of an existing operational amplifier.

FIG. 1 is a circuit diagram showing the configuration of an example of an existing operational amplifier including MOSs (see Japanese Patent Laid-Open No. Hei 4-185005 referred to as Patent Document 1 hereinafter, for example).

In FIG. 1, an operational amplifier 11 includes a subtractor circuit 12, an output amplifier circuit 13, an inverting input terminal 14, a non-inverting input terminal 15, and an output terminal 16.

The subtractor circuit 12 includes PMOSs (Positive Metal Oxide Semiconductors) 21 and 22, NMOSs (Negative Metal Oxide Semiconductors) 23 and 24, and a constant-current source 25.

In the subtractor circuit 12, the gate of the PMOS 21 is connected to the inverting input terminal 14, and the gate of the PMOS 22 is connected to the non-inverting input terminal 15. The source of the PMOS 21 and the source of the PMOS 22 are connected to one terminal of the constant-current source 25. Another terminal of the constant-current source 25 is connected to a power supply not shown in the figure for supplying a driving voltage $E_1$.

Further, in the subtractor circuit 12, the drain of the PMOS 21 and the drain of the NMOS 23 are connected to each other, and the drain of the PMOS 22 and the drain of the NMOS 24 are connected to each other. The sources of the NMOSs 23 and 24 are each grounded. The gate of the NMOS 23 and the gate of the NMOS 24 are connected to each other. A point of connection between the gate of the NMOS 23 and the gate of the NMOS 24 is connected to a point of connection between the drain of the PMOS 21 and the drain of the NMOS 23. A point of connection between the drain of the PMOS 22 and the drain of the NMOS 24 is connected to the output amplifier circuit 13.

The output amplifier circuit 13 includes an NMOS 31, a capacitor 32, and a constant-current source 33.

In the output amplifier circuit 13, the gate of the NMOS 31 and one terminal of the capacitor 32 are connected to each other. A point of connection between the gate of the NMOS 31 and the one terminal of the capacitor 32 is connected to the point of connection between the drain of the PMOS 22 and the drain of the NMOS 24 in the subtractor circuit 12. The source of the NMOS 31 is grounded. The drain of the NMOS 31 is connected to another terminal of the capacitor 32, one terminal of the constant-current source 33, and the output terminal 16. Another terminal of the constant-current source 33 is connected to a power supply not shown in the figure for supplying the driving voltage $E_1$.

In the operational amplifier 11, a first input voltage is input to the inverting input terminal 14, and a second input voltage is input to the non-inverting input terminal 15. A voltage obtained by subtracting the first input voltage from the second input voltage is supplied from the subtractor circuit 12 to the output amplifier circuit 13. The output amplifier circuit 13 then amplifies the voltage supplied from the subtractor circuit 12. The voltage amplified by the output amplifier circuit 13 is output as an output voltage from the output terminal 16.

The thus formed operational amplifier 11 is generally referred to as a Barton amplifier, and is generally used in a bipolar process and a MOS process.

In this case, the constant-current source 25 is also formed by a semiconductor element, and the subtractor circuit 12 in the operational amplifier 11 is formed by stacking semiconductor elements in three stages. That is, as shown in FIG. 1, the subtractor circuit 12 has a configuration such that the constant-current source 25, the PMOS 21 or 22, and the NMOS 23 or 24 are connected in series with each other between the driving voltage $E_1$ supplied to the constant-current source 25 and a ground level.

Hence, a voltage supplied to each of the constant-current source 25, the PMOS 21 or 22, and the NMOS 23 or 24 is lower than the driving voltage $E_1$. Thus, in order to drive each of the constant-current source 25, the PMOS 21 or 22, and the NMOS 23 or 24, a voltage equal to or higher than a voltage obtained by adding together voltages necessary to drive the constant-current source 25, the PMOS 21 or 22, and the NMOS 23 or 24, respectively, needs to be set as the driving voltage $E_1$.

Thus, because a voltage equal to or higher than the voltage obtained by adding together the voltages necessary to drive the constant-current source 25, the PMOS 21 or 22, and the NMOS 23 or 24, respectively, needs to be set as the driving voltage $E_1$, the subtractor circuit 12 and, in turn, the operational amplifier 11 may not be suitable for driving at a low voltage.

SUMMARY OF THE INVENTION

Electronic devices that can be driven at a low voltage have recently been desired. However, as described above, the existing subtractor circuit and the existing operational amplifier are not suitable for driving at a low voltage.

The present invention has been made in view of such a situation, and it is desirable to be able to provide a circuit advantageous for driving at a low voltage.

According to a first embodiment of the present invention, there is provided a subtractor circuit for outputting an output voltage as a difference between a first input voltage and a second input voltage, the subtractor circuit may include a first semiconductor element, a second semiconductor element, a third semiconductor element, a fourth semiconductor element, a fifth semiconductor element, and a sixth semiconductor element configured to each invert a voltage input to an input terminal and output the inverted voltage from an output terminal; an input terminal of the first semiconductor element being connected to a first terminal to which the first input voltage is input; an input terminal of the second semiconductor element being connected to a second terminal to which the second input voltage is input; an output terminal of the first semiconductor element being connected to an input terminal of the third semiconductor element and an output terminal of the fourth semiconductor element; an output terminal of the third semiconductor element being connected to an input terminal of the fifth semiconductor element; the input terminal and an output terminal of the fifth semiconductor element being short-circuited, and the output terminal of the fifth semiconductor element being connected to an output terminal of the second semiconductor element and an input terminal of the sixth semiconductor element; and an output terminal of the sixth semiconductor element being connected to an input terminal of the fourth semiconductor element and a third terminal from which the output voltage is output.

In the first embodiment of the present invention, the first input voltage may be input to the first semiconductor element, and the second input voltage may be input to the second semiconductor element. An output from the first semiconductor element and an output from the fourth semiconductor element may be input to the third semiconductor element. An output of the third semiconductor element may be input to the fifth semiconductor element. The input terminal and the output terminal of the fifth semiconductor element may be short-circuited. An output of the second semiconductor element, the output of the third semiconductor element, and an output of the fifth semiconductor element may be input to the sixth semiconductor element. An output of the sixth semiconductor element may be input to the fourth semiconductor element, and output as the output voltage.

According to a second embodiment of the present invention, there is provided an operational amplifier which may include a subtractor circuit configured to output an output voltage as a difference between a first input voltage and a second input voltage; and an amplifier circuit configured to amplify the output voltage from the subtractor circuit, and output the amplified output voltage; wherein the subtractor circuit includes a first semiconductor element, a second semiconductor element, a third semiconductor element, a fourth semiconductor element, a fifth semiconductor element, and a sixth semiconductor element for each inverting a voltage input to an input terminal and outputting the inverted voltage from an output terminal, an input terminal of the first semiconductor element being connected to a first terminal to which the first input voltage is input, an input terminal of the second semiconductor element being connected to a second terminal to which the second input voltage is input, an output terminal of the first semiconductor element being connected to an input terminal of the third semiconductor element and an output terminal of the fourth semiconductor element, an output terminal of the third semiconductor element being connected to an input terminal of the fifth semiconductor element, the input terminal and an output terminal of the fifth semiconductor element being short-circuited, and the output terminal of the fifth semiconductor element being connected to an output terminal of the second semiconductor element and an input terminal of the sixth semiconductor element, and an output terminal of the sixth semiconductor element being connected to an input terminal of the fourth semiconductor element and a third terminal from which the output voltage is output, and the third terminal is connected to an input terminal of the amplifier circuit.

In the second embodiment of the present invention, the first input voltage may be input to the first semiconductor element, and the second input voltage may be input to the second semiconductor element. An output from the first semiconductor element and an output from the fourth semiconductor element may be input to the third semiconductor element. An output of the third semiconductor element may be input to the fifth semiconductor element. The input terminal and the output terminal of the fifth semiconductor element may be short-circuited. An output of the second semiconductor element, the output of the third semiconductor element, and an output of the fifth semiconductor element may be input to the sixth semiconductor element. An output of the sixth semiconductor element may be input to the fourth semiconductor element, and may be input to the amplifier circuit to be amplified and then output by the amplifier circuit.

According to the first or second embodiment of the present invention, it is possible to provide a circuit advantageous for driving at a low voltage.

DETAILED DESCRIPTION

Preferred embodiments of the present invention will hereinafter be described. Correspondences between constitutional requirements of the present invention and embodiments described in the specification or the drawings are illustrated as follows. This description is to confirm that embodiments supporting the present invention are described in the specification or the drawings. Therefore, even when there is an embodiment described in the specification or drawings but not described here as an embodiment corresponding to a constitutional requirement of the present invention, it does not signify that the embodiment does not correspond to the constitutional requirement. Conversely, even when an embodiment is described here as corresponding to a constitutional requirement, it does not signify that the embodiment does not correspond to constitutional requirements other than that constitutional requirement.

A subtractor circuit according to a first embodiment of the present invention is a subtractor circuit configured to output an output voltage as a difference between a first input voltage and a second input voltage, the subtractor circuit including: a first semiconductor element, a second semiconductor element, a third semiconductor element, a fourth semiconductor element, a fifth semiconductor element, and a sixth semiconductor element (for example CMOS inverters $52_1$ to $52_6$ in FIG. 2) configured to each invert a voltage input to an input terminal and output the inverted voltage from an output terminal; an input terminal of the first semiconductor element being connected to a first terminal to which the first input voltage is input; an input terminal of the second semiconductor element being connected to a second terminal to which the second input voltage is input; an output terminal of the first semiconductor element being connected to an input terminal of the third semiconductor element and an output terminal of the fourth semiconductor element; an output terminal of the third semiconductor element being connected to an input terminal of the fifth semiconductor element; the input terminal and an output terminal of the fifth semiconductor element being short-circuited, and the output terminal of the fifth semiconductor element being connected to an output terminal of the second semiconductor element and an input terminal of the sixth semiconductor element; and an output terminal of the sixth semiconductor element being connected to an input terminal of the fourth semiconductor element and a third terminal from which the output voltage is output.

The subtractor circuit according to a first embodiment of the present invention can further include a seventh semiconductor element (for example a CMOS inverter $52_7$ in FIG. 4) having an input terminal connected to a point of connection between the output terminal of the first semiconductor element and the output terminal of the fourth semiconductor element, and having an output terminal connected to the input terminal of the third semiconductor element.

An operational amplifier according to a second embodiment of the present invention includes: a subtractor circuit (for example a subtractor circuit 51' in FIG. 6) configured to output an output voltage as a difference between a first input voltage and a second input voltage; and an amplifier circuit (for example an amplifier circuit 72 in FIG. 6) configured amplify the output voltage from the subtractor circuit, and output the amplified output voltage; wherein the subtractor circuit includes a first semiconductor element, a second semiconductor element, a third semiconductor element, a fourth semiconductor element, a fifth semiconductor element, and a sixth semiconductor element (for example CMOS inverters $52_1$ to $52_6$ in FIG. 2) for each inverting a voltage input to an input terminal and outputting the inverted voltage from an output terminal, an input terminal of the first semiconductor element being connected to a first terminal to which the first input voltage is input, an input terminal of the second semiconductor element being connected to a second terminal to which the second input voltage is input, an output terminal of the first semiconductor element being connected to an input terminal of the third semiconductor element and an output terminal of the fourth semiconductor element, an output terminal of the third semiconductor element being connected to an input terminal of the fifth semiconductor element, the input terminal and an output terminal of the fifth semiconductor element being short-circuited, and the output terminal of the fifth semiconductor element being connected to an output terminal of the second semiconductor element and an input terminal of the sixth semiconductor element, and an output terminal of the sixth semiconductor element being connected to an input terminal of the fourth semiconductor element and a third terminal from which the output voltage is output, and the third terminal is connected to an input terminal of the amplifier circuit.

In the operational amplifier according to the second embodiment of the present invention, the subtractor circuit can further include a seventh semiconductor element (for example a CMOS inverter $52_7$ in FIG. 4) having an input terminal connected to a point of connection between the output terminal of the first semiconductor element and the output terminal of the fourth semiconductor element, and having an output terminal connected to the input terminal of the third semiconductor element.

Concrete embodiments to which the present invention is applied will hereinafter be described in detail with reference to the drawings.

Figure 2:
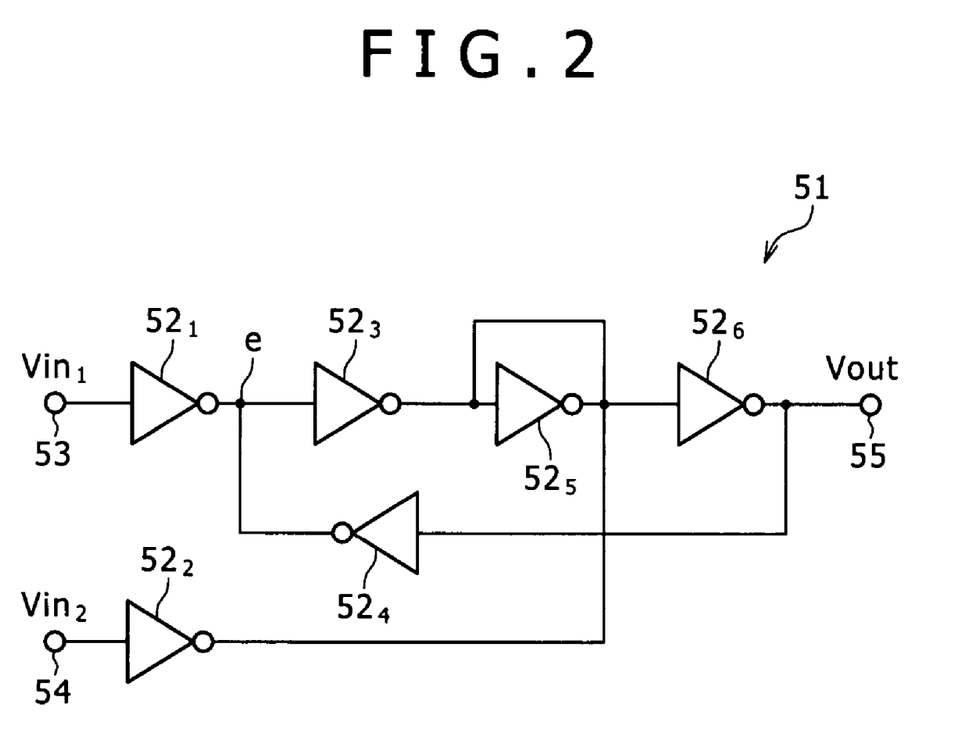
FIG. 2 is a circuit diagram showing an example of configuration of an embodiment of a subtractor circuit to which the present invention is applied.

FIG. 2 is a circuit diagram showing an example of configuration of an embodiment of a subtractor circuit to which the present invention is applied.

In FIG. 2, the subtractor circuit 51 includes CMOS inverters $52_1$ to $52_6$, an inverting input terminal 53, a non-inverting input terminal 54, and an output terminal 55.

The CMOS inverters $52_1$ to $52_6$ invert a voltage input to an input terminal of each of the CMOS inverters $52_1$ to $52_6$, and output the inverted voltage from an output terminal of each of the CMOS inverters $52_1$ to $52_6$.

The input terminal of the CMOS inverter $52_1$ is connected to the inverting input terminal 53. The input terminal of the CMOS inverter $52_2$ is connected to the non-inverting input terminal 54.

The output terminal of the CMOS inverter $52_1$ is connected to the input terminal of the CMOS inverter $52_3$ and the output terminal of the CMOS inverter $52_4$. A point of connection between the output terminal of the CMOS inverter $52_1$, the input terminal of the CMOS inverter $52_3$, and the output terminal of the CMOS inverter $52_4$ will hereinafter be referred to as a connection point e as appropriate.

The output terminal of the CMOS inverter $52_3$ is connected to the input terminal of the CMOS inverter $52_5$. The input terminal and the output terminal of the CMOS inverter $52_5$ are short-circuited, and the output terminal of the CMOS inverter $52_5$ is connected to the input terminal of the CMOS inverter $52_6$ and the output terminal of the CMOS inverter $52_2$.

The output terminal of the CMOS inverter $52_6$ is connected to the output terminal 55 and the input terminal of the CMOS inverter $52_4$.

The CMOS inverters $52_1$ to $52_6$ are all of a same circuit configuration. When the CMOS inverters $52_1$ to $52_6$ do not need to be individually differentiated from each other, the CMOS inverters $52_1$ to $52_6$ will hereinafter be referred to as a CMOS inverter 52.

Figure 3:
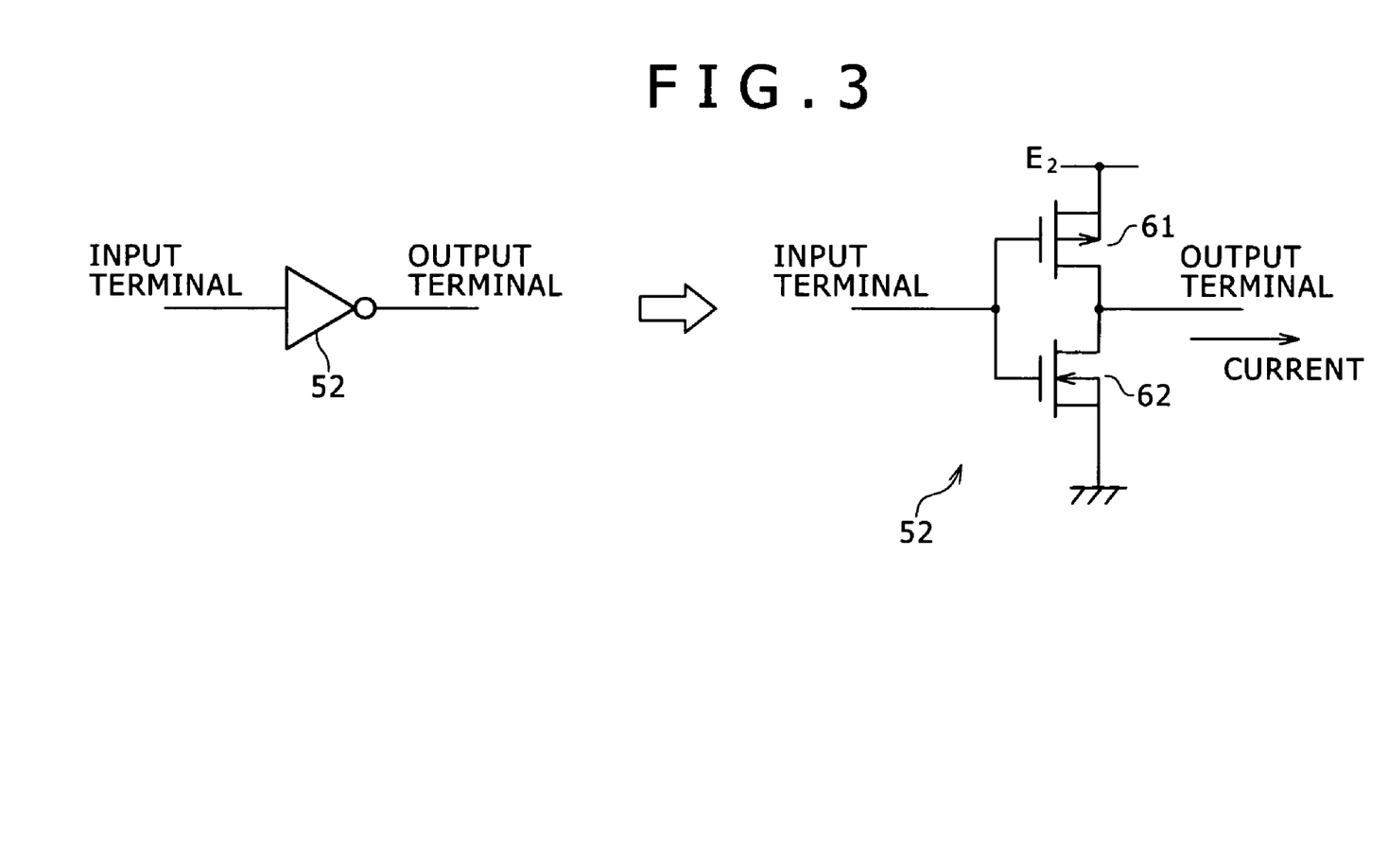
FIG. 3 is a circuit diagram showing an example of configuration of a CMOS inverter.

FIG. 3 is a circuit diagram showing an example of configuration of the CMOS inverter 52.

The CMOS inverter 52 is formed by a PMOS 61 and an NMOS 62.

The gate of the PMOS 61 and the gate of the NMOS 62 are connected to the input terminal of the CMOS inverter 52. The source of the PMOS 61 is connected to a power supply not shown in the figure for supplying a driving voltage $E_2$. The source of the NMOS 62 is grounded. The drain of the PMOS 61 and the drain of the NMOS 62 are connected to the output terminal of the CMOS inverter 52.

The CMOS inverter 52 controls a current output from the output terminal according to a voltage input to the input terminal. Thus, letting V be the voltage supplied to the input terminal of the CMOS inverter 52, and letting I be the current output from the output terminal of the CMOS inverter 52 (flowing in the direction of an arrow shown in FIG. 3), the voltage V and the current I have a relation expressed by the following equation.

[Equation 1]

$$I = -V \cdot g_m \quad (1)$$

where a conductance $g_m$ is a value indicating the ability of the CMOS inverter 52 to control the current I according to the voltage V (that is, a voltage-to-current conversion ability).

As described above, the CMOS inverters $52_1$ to $52_6$ are all of the same circuit configuration. Suppose that the respective conductances $g_m$ of the CMOS inverters $52_1$ to $52_6$ are a same value.

Description will next be made of a voltage $Vin_1$ input to the inverting input terminal 53, a voltage $Vin_2$ input to the non-inverting input terminal 54, and a voltage Vout output from the output terminal 55 in the subtractor circuit 51 shown in FIG. 2.

The voltage $Vin_1$ is input from the inverting input terminal 53 to the input terminal of the CMOS inverter $52_1$. From the above-described Equation (1), a current $i_1$ output from the output terminal of the CMOS inverter $52_1$ is expressed by Equation (2).

[Equation 2]

$$i_1 = -Vin_1 \cdot g_m \qquad (2)$$

A voltage equal to the voltage Vout output from the output terminal 55 is input to the input terminal of the CMOS inverter $52_4$. Thus, from the above-described Equation (1), a current $i_o$ output from the output terminal of the CMOS inverter $52_4$ is expressed by Equation (3).

[Equation 3]

$$i_o = -Vout \cdot g_m \qquad (3)$$

The CMOS inverter 52 can be regarded as an equivalent circuit formed by a constant-current source that outputs, from the output terminal, a current corresponding to a voltage input to the input terminal and a resistance (hereinafter referred to as a drain resistance as appropriate) that has one terminal connected to the output terminal and another terminal connected to a ground. The connection point e can be regarded as being grounded via a circuit formed by connecting a drain resistance regarded as being connected to the output terminal of the CMOS inverter $52_1$ and a drain resistance regarded as being connected to the output terminal of the CMOS inverter $52_4$ in parallel with each other. Thus, letting Rd be the resistance values of the drain resistances of the CMOS inverters $52_1$ to $52_6$, the connection point e can be regarded as being grounded via a resistance having a resistance value Re (Re=Rd/2).

The input impedance of the CMOS inverter is very high. Supposing that no current flows into the input terminal of the CMOS inverter $52_3$ connected to the connection point e, the current $i_1$ output from the output terminal of the CMOS inverter $52_1$ and the current $i_o$ output from the output terminal of the CMOS inverter $52_4$ can be regarded as flowing to a ground level via the resistance having the resistance value Re. Thus, the voltage value Ve of the connection point e is expressed by Equation (4).

[Equation 4]

$$Ve = (i_1 + i_o) \cdot Re \qquad (4)$$

From Equation (2) and Equation (3), Equation (4) can be modified into the following equation.

[Equation 5]

$$Ve = -(Vin_1 \times g_m + Vout \times g_m) \cdot Re \qquad (5)$$

The voltage Vout output from the output terminal 55 can be obtained by Equation (6) on the basis of the circuit configuration of the CMOS inverters $52_2$ to $52_6$.

[Equation 6]

$$Vout = (Ve \cdot g_m + Vin_2 \cdot g_m) \cdot \frac{1}{g_m} \cdot g_m \cdot Rd = (Ve + Vin_2) \cdot g_m \cdot Rd \qquad (6)$$

By modifying Equation (6), the voltage Ve of the connection point e can be obtained by the following equation.

[Equation 7]

$$Ve = \frac{Vout}{g_m \cdot Rd} - Vin_2 \qquad (7)$$

Equation (5) and Equation (7) both express Ve, and thus Equation (8) is obtained from Equation (5) and Equation (7).

[Equation 8]

$$Ve = \frac{Vout}{g_m \cdot Rd} - Vin_2 = -(Vin_1 \cdot g_m + Vout \cdot g_m) \cdot Re \qquad (8)$$

Equation (9) can be derived by modifying Equation (8).

[Equation 9]

$$-Vin_1 \cdot g_m \cdot Re + Vin_2 = \frac{Vout}{g_m \cdot Rd} + Vout \cdot g_m \cdot Re \qquad (9)$$

$$= Vout \cdot \left( \frac{1}{g_m \cdot Rd} + g_m \cdot Re \right)$$

From Equation (9), the voltage Vout output from the output terminal 55 can be obtained by the following equation.

[Equation 10]

$$Vout = \frac{-Vin_1 \cdot g_m \cdot Re + Vin_2}{\frac{1}{g_m \cdot Rd} + g_m \cdot Re} \qquad (10)$$

$$= \frac{-Vin_1 \cdot g_m \cdot Re \cdot g_m \cdot Rd + Vin_2 \cdot g_m \cdot Rd}{1 + g_m \cdot Re \cdot g_m \cdot Rd}$$

$$= \frac{-Vin_1 + \frac{Vin_2}{g_m \cdot Re}}{\frac{1}{g_m \cdot Re \cdot g_m \cdot Rd} + 1}$$

The resistance value Rd of the drain resistance is generally a few hundred kΩ to a few ten MΩ, so that $g_m \cdot Re \cdot g_m \cdot Rd$ is a very high value as compared with one. Therefore $1/(g_m \cdot Re \cdot g_m \cdot Rd)$ in Equation (10) can be approximated to zero. Thus, Equation (10) can be approximated as expressed by the following equation.

[Equation 11]

$$Vout \approx -Vin_1 + \frac{Vin_2}{g_m \cdot Re} \qquad (11)$$

As shown in Equation (11), the voltage Vout output from the output terminal 55 of the subtractor circuit 51 is a difference between the voltage $Vin_1$ input to the inverting input terminal 53 and a value obtained by dividing the voltage $Vin_2$ input to the non-inverting input terminal 54 by $g_m \cdot Re$.

As described above, the resistance value Re is the resistance value of the resistance regarded as existing between the connection point e and the ground level. When for example a new resistance is provided between the connection point e and the ground level to set the resistance value of the resistance regarded as existing between the connection point e and the ground level at $1/g_m$, the voltage Vout output from the output terminal 55 has a relation Vout≈−$Vin_1$+$Vin_2$, from Equation (11).

That is, in the subtractor circuit configured such that the resistance value Re in Equation (11) is $1/g_m$, the voltage Vout output from the output terminal 55 is a difference between the voltage $Vin_1$ input to the inverting input terminal 53 and the voltage $Vin_2$ input to the non-inverting input terminal 54.

Figure 4:
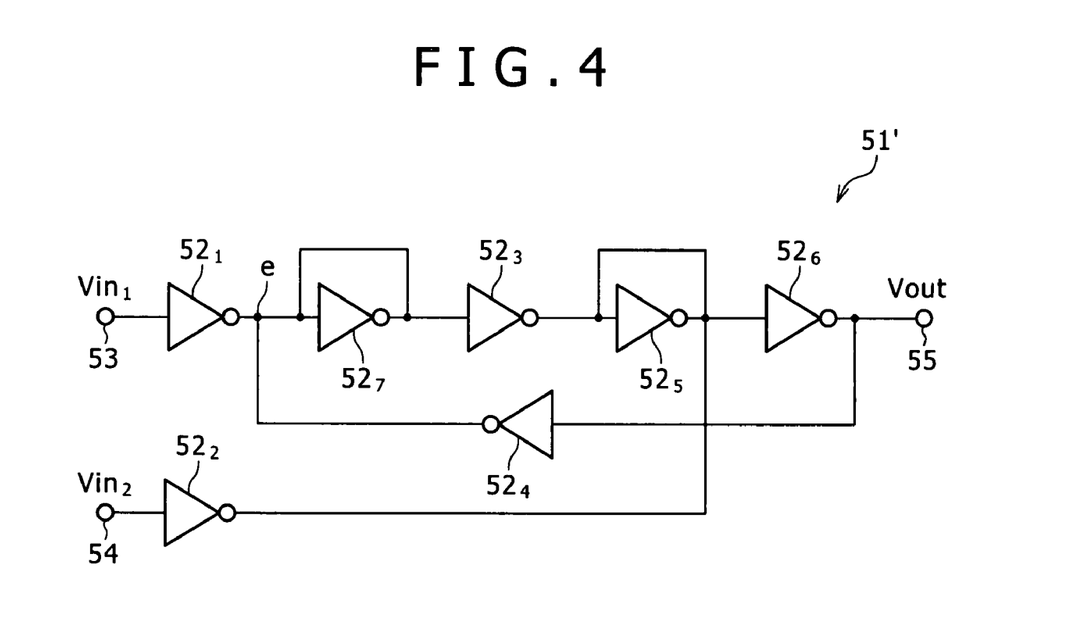
FIG. 4 is a circuit diagram showing an example of configuration of another embodiment of the subtractor circuit.

FIG. 4 is a circuit diagram showing an example of configuration of another embodiment of the subtractor circuit.

In FIG. 4, a subtractor circuit 51' includes CMOS inverters 52$_1$ to 52$_7$, an inverting input terminal 53, a non-inverting input terminal 54, and an output terminal 55. Incidentally, in FIG. 4, parts corresponding to those of the subtractor circuit 51 in FIG. 2 are identified by the same reference numerals, and description thereof will be omitted in the following as appropriate.

Specifically, the subtractor circuit 51' in FIG. 4 is similar to the subtractor circuit 51 in FIG. 2 in that the subtractor circuit 51' includes the CMOS inverters 52$_1$ to 52$_6$, the inverting input terminal 53, the non-inverting input terminal 54, and the output terminal 55. However, the subtractor circuit 51' is different from the subtractor circuit 51 in FIG. 2 in that the subtractor circuit 51' has the CMOS inverter 52$_7$ between a connection point e and the CMOS inverter 52$_3$.

As shown in FIG. 4, an input terminal and an output terminal of the CMOS inverter 52$_7$ in the subtractor circuit 51' are short-circuited. In addition, the input terminal of the CMOS inverter 52$_7$ is connected to the connection point e, and the output terminal of the CMOS inverter 52$_7$ is connected to an input terminal of the CMOS inverter 52$_3$.

Figure 5:
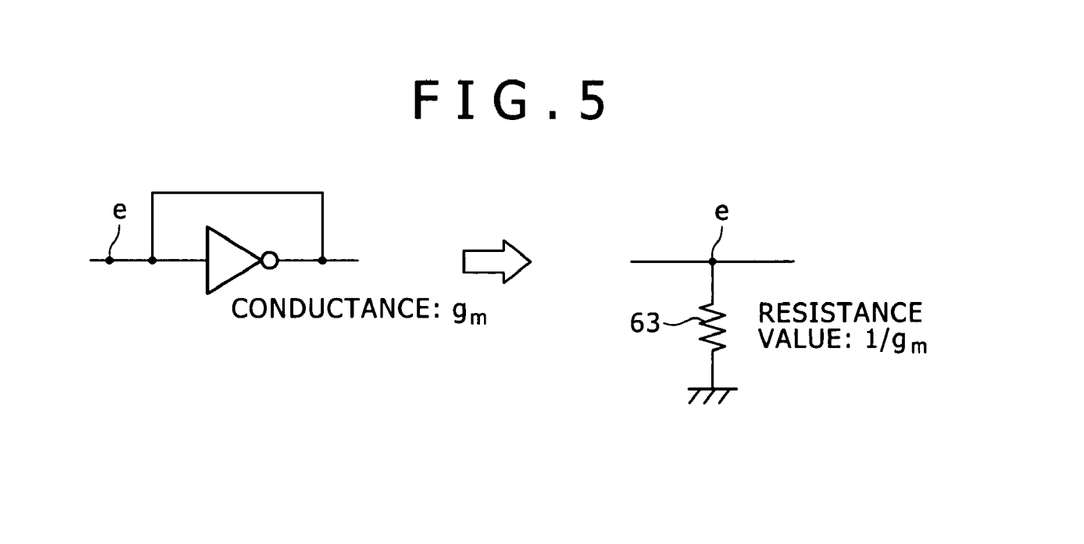
FIG. 5 is a diagram of assistance in explaining a CMOS inverter functioning as a resistance.

The CMOS inverter 52$_7$ having the output terminal and the input terminal thus short-circuited functions as a resistance. That is, as shown in FIG. 5, the CMOS inverter 52$_7$ having a conductance $g_m$ functions in a same manner as a resistance 63 whose resistance value is a reciprocal of the conductance $g_m$ and which has one terminal connected to the connection point e and another terminal connected to a ground.

Thus, in the subtractor circuit 51', the connection point e can be regarded as being grounded by the CMOS inverter 52$_7$ via a circuit formed by connecting a resistance having a resistance value Re and the resistance having the resistance value $1/g_m$ in parallel with each other.

The resistance value $1/g_m$ of the resistance regarded as being connected to the connection point e by the CMOS inverter 52$_7$ is generally much lower than the resistance value Rd of the drain resistance of the CMOS inverter 52, or in turn the resistance value Re of the resistance regarded as being connected to the connection point e by the CMOS inverters 52$_1$ and 52$_4$. Hence, the connection point e can be regarded as being grounded via the resistance having the resistance value $1/g_m$.

Thus, because the connection point e can be regarded as being grounded via the resistance having the resistance value $1/g_m$, for a voltage Vout output from the output terminal 55 of the subtractor circuit 51', the resistance value Re of the resistance regarded as existing between the connection point e and a ground level in Equation (11) expressing the voltage Vout output from the subtractor circuit 51 of FIG. 2 can be replaced with the resistance value $1/g_m$. Hence, the voltage Vout output from the output terminal 55 of the subtractor circuit 51' has a relation Vout≈−$Vin_1$+$Vin_2$, from Equation (11).

As described above, the subtractor circuit 51' can output, from the output terminal 55, the voltage Vout as a difference between the voltage $Vin_1$ input to the inverting input terminal 53 and the voltage $Vin_2$ input to the non-inverting input terminal 54.

In addition, because the subtractor circuit 51' is formed by only the plurality of CMOS inverters 52, the input dynamic range of the subtractor circuit 51' can be extended to a voltage substantially equal to the driving voltage $E_2$ (FIG. 3) supplied to each CMOS inverter 52, and the output dynamic range of the subtractor circuit 51' can also be extended to a voltage substantially equal to the driving voltage $E_2$.

The input dynamic range or the output dynamic range of the existing subtractor circuit may not be extended to the driving voltage. Hence, supposing that the driving voltage $E_2$ of the subtractor circuit 51' is equal to the driving voltage of the existing subtractor circuit, the input dynamic range or the output dynamic range of the subtractor circuit 51' is wider than that of the existing subtractor circuit.

In addition, the distortion characteristic of a subtractor circuit is generally improved when the input dynamic range or the output dynamic range of the subtractor circuit is widened. Therefore the distortion characteristic of the subtractor circuit 51' can be made better than the distortion characteristic of the existing subtractor circuit. Alternatively, the subtractor circuit 51' can obtain a distortion characteristic equal to the distortion characteristic of the existing subtractor circuit even when the driving voltage $E_2$ of the subtractor circuit 51' is made lower than the driving voltage of the existing subtractor circuit.

In addition, as described with reference to FIG. 1, the subtractor circuit 12 formed by stacking semiconductor elements in three stages is disadvantageous for driving at a low voltage. On the other hand, the subtractor circuit 51', which includes the CMOS inverters 52 each formed by a pair of the PMOS 61 and the NMOS 62, is more advantageous for driving at a low voltage than the subtractor circuit 12 formed by stacking semiconductor elements in three stages.

Incidentally, as with the subtractor circuit 51', the subtractor circuit 51 in FIG. 2 is formed by a plurality of CMOS inverters 52, and is thus more advantageous than the existing subtractor circuit in terms of the distortion characteristic and driving at a low voltage.

Figure 6:
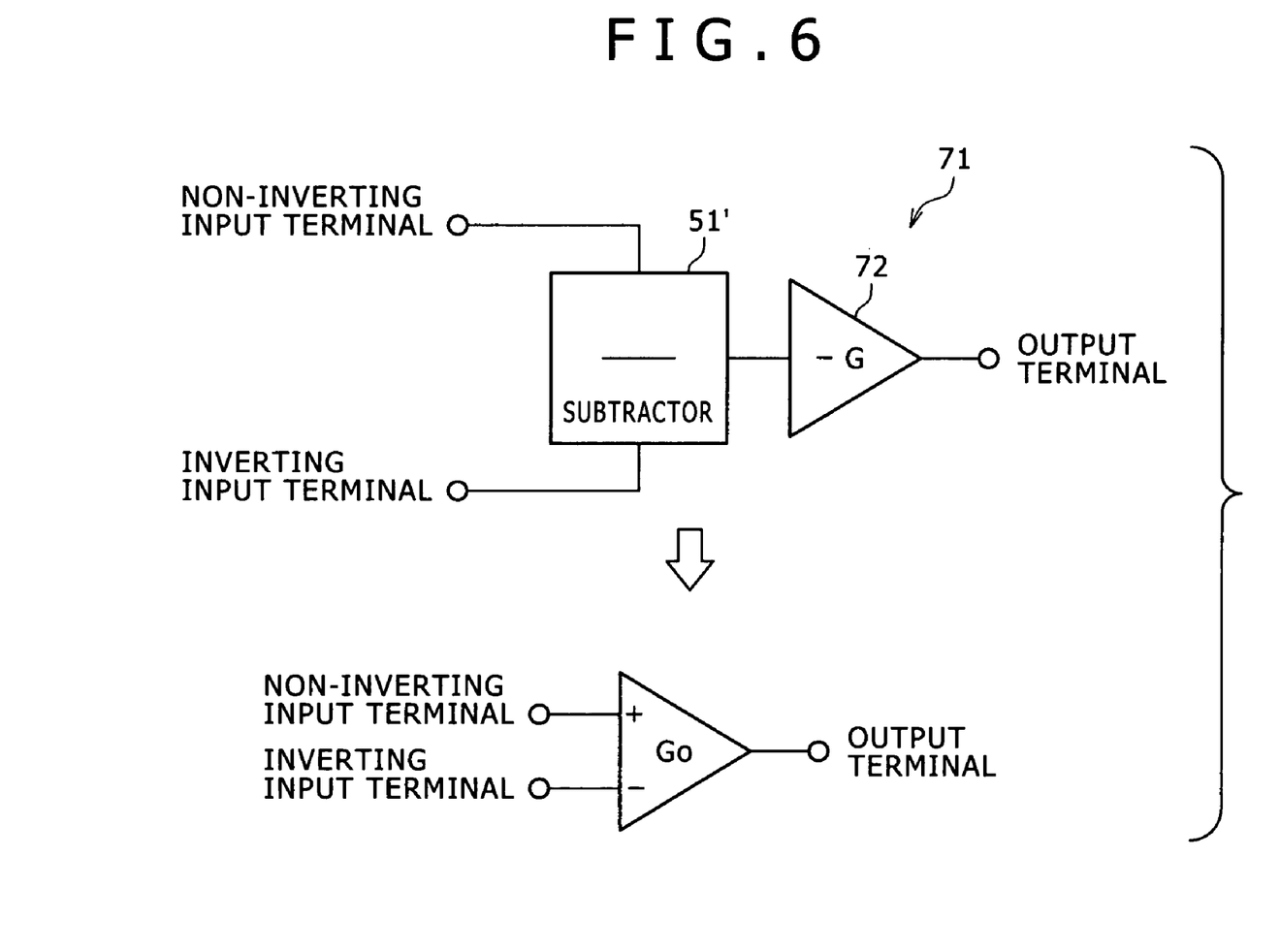
FIG. 6 is a circuit diagram showing an example of configuration of an embodiment of an operational amplifier to which the present invention is applied.

FIG. 6 is a circuit diagram showing an example of configuration of an embodiment of an operational amplifier to which the present invention is applied.

An upper side of FIG. 6 shows an operational amplifier 71 formed by connecting an amplifier circuit 72 in a stage succeeding a subtractor circuit 51'. The operational amplifier 71 shown on the upper side of FIG. 6 can be represented by a symbol of the operational amplifier as shown on a lower side of FIG. 6.

When a voltage $Vin_1'$ is input to an inverting input terminal, and a voltage $Vin_2'$ is input to a non-inverting input terminal, the subtractor circuit 51' outputs a voltage as a difference between the voltage $Vin_1'$ and the voltage $Vin_2'$ to input the voltage as the difference between the voltage $Vin_1'$ and the voltage $Vin_2'$ to the input terminal of the amplifier circuit 72. The amplifier circuit 72 inverts and amplifies the voltage input to the input terminal with a predetermined amplification factor (open-loop gain) G, and then outputs the inverted and amplified voltage Vout' from an output terminal.

The amplifier circuit 72 can be formed by one CMOS. The amplification factor G of the amplifier circuit 72 can be increased as much as performances such as current consumption, a noise figure and the like permit.

Letting $g_m$ be the conductance of the CMOS forming the amplifier circuit 72, and letting Rd be the resistance value of a drain resistance, the amplification factor G of the amplifier circuit 72 is $G=g_m \cdot Rd$. Thus, the voltage Vout' output from the output terminal of the operational amplifier 71 is expressed by the following equation.

[Equation 12]

$$Vout' \approx -(Vin'_1 - Vin'_2) \cdot (-g_m \cdot Rd) \approx (Vin'_1 - Vin'_2) \cdot g_m \cdot Rd \quad (12)$$

As described above, the operational amplifier 71 includes the subtractor circuit 51' formed by a plurality of CMOS inverters 52 and the amplifier circuit 72 formed by one CMOS. Because the input dynamic range and the output dynamic range of the subtractor circuit 51' are wider than those of the existing subtractor circuit, as described above, the input dynamic range and the output dynamic range of the operational amplifier 71 are also wider than those of the existing operational amplifier.

In addition, because the subtractor circuit 51' is more advantageous for driving at a low voltage than the existing subtractor circuit, the operational amplifier 71 is also more advantageous for driving at a low voltage than the existing operational amplifier. That is, the operational amplifier 71 can be driven normally with a low driving voltage with which the existing operational amplifier may not be driven normally.

Further, because the CMOS is a semiconductor element consuming low power, the operational amplifier 71 formed by CMOSs consumes lower power than the existing operational amplifier.

In addition, in the existing operational amplifier, to improve a noise figure may require for example an increase in size of transistors forming the subtractor circuit or an increase in bias current of the transistors. The increase in size of the transistors can deteriorate a frequency characteristic, or the increase in bias current of the transistors can increase power consumption.

In the operational amplifier 71, on the other hand, the noise figure can be lowered by increasing the conductance $g_m$ of the CMOS inverters 52 forming the subtractor circuit 51', and thus an excellent noise figure can be obtained with a small circuit configuration. Incidentally, the conductance $g_m$ of the CMOS inverter 52 is a value obtained by adding together the conductance of the PMOS 61 (FIG. 3) and the conductance of the NMOS 62 (FIG. 3), the PMOS 61 and the NMOS 62 forming the CMOS inverter 52. In addition, an excellent noise figure can be obtained without current consumption being increased.

Since the operational amplifier 71 is formed by CMOSs, the operational amplifier 71 can be produced by a full-CMOS process, and a chip having a digital circuit and an analog circuit mixed thereon can be produced easily by a CMOS process. Further, since the operational amplifier 71 is formed by CMOSs, all ICs necessary for analog circuits such as a filter, an amplifier and the like can be realized with CMOSs as basic constituent elements.

A voltage input to the inverting input terminal 53 or the non-inverting input terminal 54 of the subtractor circuit 51' is input to the CMOS inverter $52_1$ or the CMOS inverter $52_2$, and then converted into a current corresponding to the conductance $g_m$. That is, because the voltage (signal) input to the subtractor circuit 51' is received by a very high input impedance, the subtractor circuit 51' constitutes a light load for the voltage from a preceding stage or is easily driven. This indicates that it is easy to connect the operational amplifier 71 including the subtractor circuit 51' to a circuit in the preceding stage.

For example, if a circuit in a subsequent stage following the circuit in the preceding stage has a low input impedance, a buffer having a high input impedance needs to be inserted between the circuit in the preceding stage and the circuit in the subsequent stage in order to prevent a loss of the voltage (signal). Thus increasing the number of circuit elements invites an increase in current consumption and deteriorates performance such as the noise figure or the like. Therefore, the operational amplifier 71 having a very high input impedance eliminates the need for the insertion of a buffer or the like in establishing connection with the circuit in the preceding stage, and is advantageous when forming the circuit in terms of performances such as current consumption, the noise figure and the like.

Figure 7:
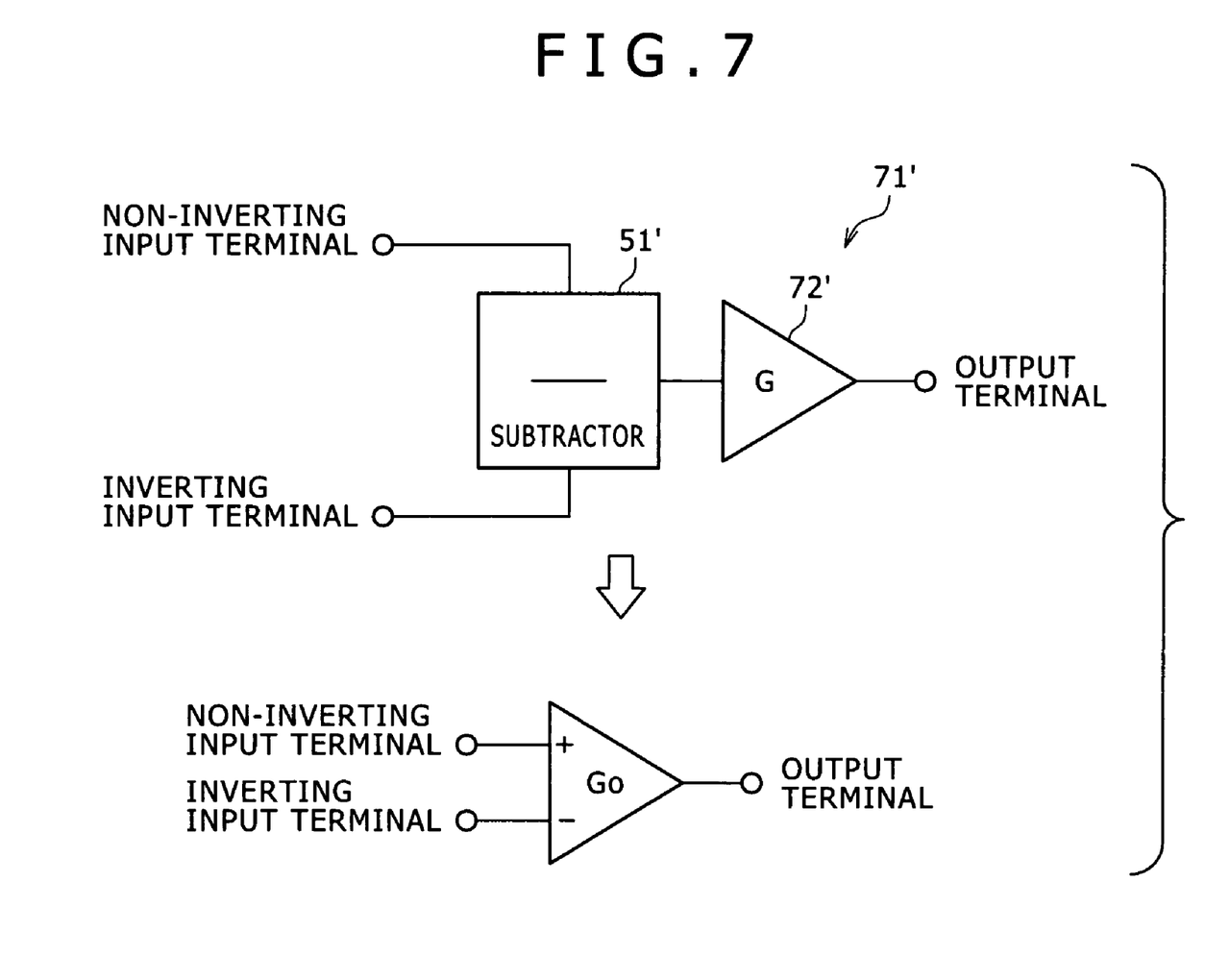
FIG. 7 is a circuit diagram showing an example of configuration of an embodiment of the operational amplifier.

Incidentally, while FIG. 6 shows the operational amplifier 71 that inverts, amplifies, and then outputs a difference between voltages input to the inverting input terminal and the non-inverting input terminal, the operational amplifier can be configured so as to amplify and output the difference between the voltages input to the inverting input terminal and the non-inverting input terminal without inverting the difference, for example. FIG. 7 is a circuit diagram showing an example of configuration of an operational amplifier 71' formed using an amplifier circuit 72' that amplifies input voltage without inverting the input voltage in place of the amplifier circuit 72 in FIG. 6.

In addition, while the operational amplifier 71 or 71' includes the subtractor circuit 51', the operational amplifier 71 or 71' may include the subtractor circuit 51 in place of the subtractor circuit 51'.

It is to be noted that embodiments of the present invention are not limited to the above-described embodiments, and that various changes can be made without departing from the spirit of the present invention.

It should be understood by those skilled in the art that various modifications, combinations, sub-combinations and alterations may occur depending on design requirements and other factors insofar as they are within the scope of the appended claims or the equivalents thereof.

The invention claimed is:

1. A subtractor circuit for outputting an output voltage as a difference between a first input voltage and a second input voltage, said subtractor circuit comprising:

a first semiconductor element, a second semiconductor element, a third semiconductor element, a fourth semiconductor element, a fifth semiconductor element, and a sixth semiconductor element configured to each invert a voltage input to an input terminal and output the inverted voltage from an output terminal;

an input terminal of said first semiconductor element being connected to a first terminal to which said first input voltage is input;

an input terminal of said second semiconductor element being connected to a second terminal to which said second input voltage is input;

an output terminal of said first semiconductor element being connected to an input terminal of said third semiconductor element and an output terminal of said fourth semiconductor element;

an output terminal of said third semiconductor element being connected to an input terminal of said fifth semiconductor element;

the input terminal and an output terminal of said fifth semiconductor element being short-circuited, and the output terminal of said fifth semiconductor element being connected to an output terminal of said second semiconductor element and an input terminal of said sixth semiconductor element; and an output terminal of said sixth semiconductor element being connected to an input terminal of said fourth semiconductor element and a third terminal from which said output voltage is output.

2. The subtractor circuit according to claim 1, further comprising a seventh semiconductor element having an input terminal connected to a point of connection between the output terminal of said first semiconductor element and the output terminal of said fourth semiconductor element, and having an output terminal connected to the input terminal of said third semiconductor element.

3. The subtractor circuit according to claim 1, wherein said first semiconductor element, said second semiconductor element, said third semiconductor element, said fourth semiconductor element, said fifth semiconductor element, and said sixth semiconductor element are a CMOS (Complementary Metal Oxide Semiconductor) formed by a pair of a PMOS (Positive Metal Oxide Semiconductor) and an NMOS (Negative Metal Oxide Semiconductor)

4. An operational amplifier comprising:
a subtractor circuit configured to output an output voltage as a difference between a first input voltage and a second input voltage; and
an amplifier circuit configured to amplify the output voltage from said subtractor circuit, and output the amplified output voltage;
wherein said subtractor circuit includes a first semiconductor element, a second semiconductor element, a third semiconductor element, a fourth semiconductor element, a fifth semiconductor element, and a sixth semiconductor element for each inverting a voltage input to an input terminal and outputting the inverted voltage from an output terminal,
an input terminal of said first semiconductor element being connected to a first terminal to which said first input voltage is input,
an input terminal of said second semiconductor element being connected to a second terminal to which said second input voltage is input,
an output terminal of said first semiconductor element being connected to an input terminal of said third semiconductor element and an output terminal of said fourth semiconductor element,
an output terminal of said third semiconductor element being connected to an input terminal of said fifth semiconductor element,
the input terminal and an output terminal of said fifth semiconductor element being short-circuited, and the output terminal of said fifth semiconductor element being connected to an output terminal of said second semiconductor element and an input terminal of said sixth semiconductor element, and
an output terminal of said sixth semiconductor element being connected to an input terminal of said fourth semiconductor element and a third terminal from which said output voltage is output, and
said third terminal is connected to an input terminal of said amplifier circuit.

5. The operational amplifier according to claim 4, wherein said subtractor circuit further includes a seventh semiconductor element having an input terminal connected to a point of connection between the output terminal of said first semiconductor element and the output terminal of said fourth semiconductor element, and having an output terminal connected to the input terminal of said third semiconductor element.

6. The operational amplifier according to claim 4, wherein said first semiconductor element, said second semiconductor element, said third semiconductor element, said fourth semiconductor element, said fifth semiconductor element, said sixth semiconductor element, and said amplifier circuit are a CMOS (Complementary Metal Oxide Semiconductor) formed by a pair of a PMOS (Positive Metal Oxide Semiconductor) and an NMOS (Negative Metal Oxide Semiconductor).

7. The subtractor circuit according to claim 1, in which said first terminal is an inverting type input terminal and said seond terminal is a non-inverting type input terminal.

8. The operational amplifier according to claim 4, in which said first terminal is an inverting type input terminal and said seond terminal is a non-inverting type input terminal.

* * * * *

UNITED STATES PATENT AND TRADEMARK OFFICE
CERTIFICATE OF CORRECTION

| | | |
|---|---|---|
| PATENT NO. | : 7,605,634 B2 | Page 1 of 1 |
| APPLICATION NO. | : 11/904026 | |
| DATED | : October 20, 2009 | |
| INVENTOR(S) | : Atsushi Hirabayashi | |

It is certified that error appears in the above-identified patent and that said Letters Patent is hereby corrected as shown below:

On the Title Page Item (30) please insert:

--FOREIGN APPLICATIONS

Japan P2006-268160   09/29/2006--;

Column 1, line 47, "figure" should read --figures--;

Column 2, line 6, "figure" should read --figures--.

Signed and Sealed this

Sixteenth Day of November, 2010

David J. Kappos
*Director of the United States Patent and Trademark Office*